United States Patent
Ratadiya et al.

(10) Patent No.: US 11,264,871 B2
(45) Date of Patent: *Mar. 1, 2022

(54) INVERTER DRIVE SYSTEM, BUS BAR AND ASSEMBLY

(71) Applicant: Transportation IP Holdings, LLC, Norwalk, CT (US)

(72) Inventors: Sarit Ratadiya, Bangalore (IN); Jacob Alan Hubbell, Erie, PA (US); Ajith Kuttannair Kumar, Erie, PA (US); Mark Murphy, Erie, PA (US); Shreenath Shekar Perlaguri, Bangalore (IN)

(73) Assignee: Transportation IP Holdings, LLC, Norwalk, CT (US)

( * ) Notice: Subject to any disclaimer, the term of this patent is extended or adjusted under 35 U.S.C. 154(b) by 53 days.

This patent is subject to a terminal disclaimer.

(21) Appl. No.: 16/600,237

(22) Filed: Oct. 11, 2019

(65) Prior Publication Data

US 2020/0044519 A1 Feb. 6, 2020

Related U.S. Application Data

(63) Continuation of application No. 14/686,939, filed on Apr. 15, 2015, now Pat. No. 10,454,349.

(51) Int. Cl.
*H02K 11/33* (2016.01)
*H02K 11/30* (2016.01)
(Continued)

(52) U.S. Cl.
CPC ............... *H02K 11/33* (2016.01); *H02K 3/51* (2013.01); *H02K 11/30* (2016.01); *H02M 7/003* (2013.01);
(Continued)

(58) Field of Classification Search
CPC .......... H02K 11/33; H02K 3/51; H02K 11/30; H02K 2203/09; H02M 7/003;
(Continued)

(56) References Cited

U.S. PATENT DOCUMENTS 5,742,005 A * 4/1998 Saka ................... B60R 16/0238
174/541
6,160,696 A 12/2000 Bailey
(Continued)

OTHER PUBLICATIONS

Office Action dated Mar. 27, 2020 for corresponding Chinese Patent application No. 201811432832.5 (7 pages).
(Continued)

*Primary Examiner* — John K Kim
(74) *Attorney, Agent, or Firm* — The Small Patent Law Group LLC; Josef L. Hoffmann

(57) ABSTRACT

An inverter drive assembly includes a first array of inverters, a second array of inverters spaced from the first array of inverters and defining a plenum therebetween, and a crossover bus bar spanning the plenum and electrically connecting the first array of inverters to the second array of inverters. The crossover bus bar includes a first laminated bus section electrically connected to the first array of inverters, a second laminated bus section electrically connected to the second array of inverters, and a solid bus connection interconnecting the first laminated bus section with the second laminated bus section.

18 Claims, 7 Drawing Sheets

(51) Int. Cl.
*H02K 3/51* (2006.01)
*H02M 7/00* (2006.01)
*H05K 7/14* (2006.01)

(52) U.S. Cl.
CPC ....... *H02K 2203/09* (2013.01); *H05K 7/1432* (2013.01)

(58) Field of Classification Search
CPC ........ H05K 7/1432; B61C 3/00; H01R 25/16; H01R 2201/26; H02P 27/06
USPC ...................................................... 310/68 D
See application file for complete search history.

(56) References Cited

U.S. PATENT DOCUMENTS

| | | | |
|---|---|---|---|
| 10,454,349 B2 * | 10/2019 | Ratadiya | H02K 11/30 |
| 2013/0215573 A1 * | 8/2013 | Wagner | H05K 7/2089 361/702 |
| 2014/0077611 A1 | 3/2014 | Young | |
| 2020/0044519 A1 * | 2/2020 | Ratadiya | H02K 11/30 |

OTHER PUBLICATIONS

English Translation of Office Action dated Mar. 27, 2020 for corresponding Chinese Patent application No. 201811432832.5 (7 pages).

* cited by examiner

INVERTER DRIVE SYSTEM, BUS BAR AND ASSEMBLY

CROSS-REFERENCE TO RELATED APPLICATIONS

This application is a continuation of, and claims priority to, U.S. application Ser. No. 14/686,939 filed Apr. 15, 2015 and the entire disclosure of which is incorporated herein by reference.

FIELD OF THE INVENTION

Embodiments of the invention relate generally to inverter drive assemblies. Other embodiments relate to an inverter drive assembly for an electric vehicle.

BACKGROUND OF THE INVENTION

Traction vehicles such as, for example, locomotives, employ electric traction motors for driving wheels of the vehicles. In some of these vehicles, the motors are alternating current (AC) motors whose speed and power are controlled by varying the frequency and current of AC electric power supplied to the motors. Commonly, the electric power is supplied at some point in the vehicle system as direct current power and is thereafter inverted to AC power of controlled frequency and amplitude. The electric power may be derived from an on-board alternator driven by an internal combustion engine or may be obtained from a wayside power source such as a third rail or overhead catenary.

In conventional systems the power is inverted in a solid-state inverter incorporating a plurality of diodes and electronic switching devices. In a locomotive, large off-highway vehicle, or transit application, the traction motors may develop more than 1000 horsepower per motor, thus requiring very high power handling capability by the associated inverter. This, in turn, requires power semiconductor switching devices such as GTOs (gate turn-off thyristors) or IGBTs that are capable of controlling such high power and of dissipating significant heat developed in the semiconductor devices due to internal loss generating characteristics.

The power semiconductor devices are typically mounted on heat transfer devices such as heat sinks, which aid in transferring heat away from the semiconductor devices and thus preventing thermal failure of the devices. An electrical circuit area in which the semiconductor devices are located may include various control and timing circuits, including low power semiconductor devices, used in controlling switching of the power semiconductor devices.

In locomotives, an inverter drive system for large AC motor applications typically includes an inverter associated with each traction motor, such that a six-axle locomotive would have six inverters, each for powering a respective one of six traction motors connected to respective ones of the six axles. In such applications, a certain number of inverters and other components may be located on, and be accessible from, one side of the locomotive (referred to the "A side" of the locomotive), while the remainder of the inverters and other components are located on, and accessible from, the other side of the locomotive (referred to the "B side" of the locomotive). In such an arrangement, the inverters on opposing sides of the locomotive may be spaced apart by as much as five feet (1.5 m), defining an air plenum therebetween which allows for the necessary circulation of ventilation air for cooling purposes.

Existing methods of connecting the multiple inverters on opposed sides of the plenum involve the use of a solid bus connection between the inverters. In particular, a solid bus bar is typically arranged at the top of the envelope and spans the plenum at the top thereof to connect the opposed inverter arrays. Such a configuration, however, increases inductance between the inverters arranged on the A side of the locomotive and the inverters arranged on the B side of the locomotive, which may lead to an increase in undesirable circulating currents. In addition, this configuration increases the height of the inverter assembly/envelope as a whole, due to the clearance requirement for a solid bus, which can be problematic when attempting to meet locomotive height or clearance requirements.

BRIEF DESCRIPTION OF THE INVENTION

In an embodiment, an inverter drive assembly includes a first array of inverters, a second array of inverters spaced from the first array of inverters and defining a plenum therebetween, and a crossover bus bar spanning the plenum and electrically connecting the first array of inverters to the second array of inverters. The crossover bus bar includes a first laminated bus section electrically connected to the first array of inverters, a second laminated bus section electrically connected to the second array of inverters, and a solid bus connection interconnecting the first laminated bus section with the second laminated bus section.

In an embodiment, a bus bar includes a first laminated bus section, a second laminated bus section, and a solid bus connection interconnecting the first laminated bus section with the second laminated bus section.

In an embodiment, a vehicle includes a plurality of AC electric motors each coupled in driving relationship to a respective pair of a plurality of pairs of wheels on the vehicle, a plurality of inverters mounted in the vehicle including at least a first inverter mounted adjacent to a first side of the vehicle and a second inverter mounted adjacent to a second, opposing side of the vehicle, the inverters being configured to receive DC electric power and to invert the DC electric power to AC electric power for application to the AC electric motors, and a crossover bus bar electrically connecting the first inverter to the second inverter. The crossover bus bar includes a first laminated bus section electrically connected to the first inverter and a second laminated bus section electrically connected to the second inverter. The first laminated bus section and the second laminated bus section are generally coplanar and are spaced apart from one another.

BRIEF DESCRIPTION OF THE DRAWINGS

The present invention will be better understood from reading the following description of non-limiting embodiments, with reference to the attached drawings, wherein below.

DETAILED DESCRIPTION OF THE INVENTION

Figure 1:
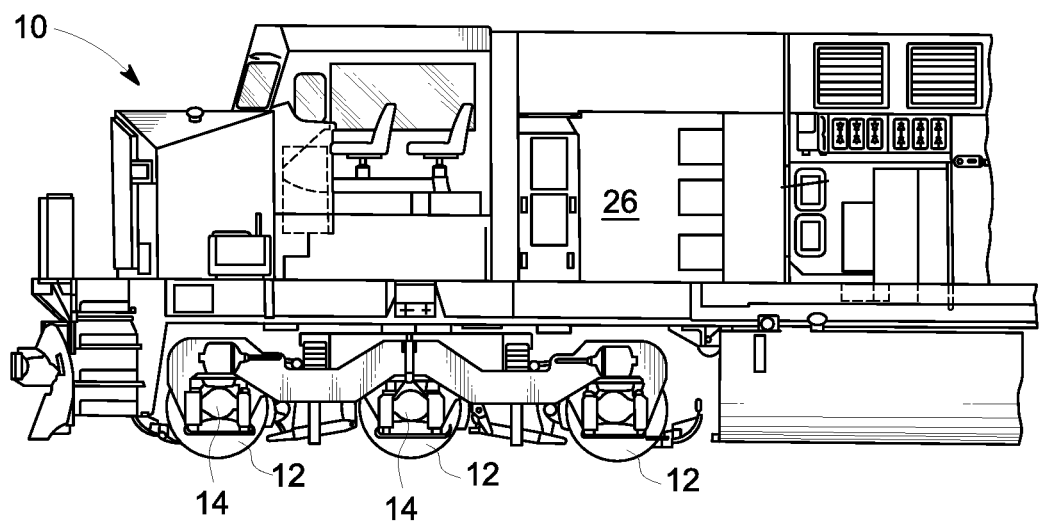
FIG. 1 is a simplified, partial schematic representation of a vehicle.

Reference will be made below in detail to exemplary embodiments of the invention, examples of which are illustrated in the accompanying drawings. Wherever possible, the same reference characters used throughout the drawings refer to the same or like parts, without duplicative description. Although exemplary embodiments of the invention are described with respect to an inverter drive assembly for a locomotive, embodiments of the invention are also applicable for use with electric machinery and vehicles generally, such as machinery that utilizes electric motors such as AC or DC motors. As used herein, "electrical contact," "electrical communication" and "electrically coupled" means that the referenced elements are directly or indirectly connected such that an electrical current may flow from one to the other. The connection may include a direct conductive connection (i.e., without an intervening capacitive, inductive or active element), an inductive connection, a capacitive connection, and/or any other suitable electrical connection. Intervening components may be present.

FIG. 1 is a simplified, partial cross-sectional view of an electric traction vehicle 10, which is illustrated as a locomotive. Although a locomotive is shown in FIG. 1, embodiments of the invention are also applicable to traction systems wherein power is received from an external power generation source and distributed via a catenary or third rail, as well as to electric machinery that utilizes electric motors, more generally.

The vehicle 10 of FIG. 1 includes a plurality of traction motors, not visible in the figure but located behind the drive wheels 12 and coupled in driving relationship to axles 14. The motors may be alternating current (AC) electric motors. The vehicle also includes a plurality of electrical inverter circuits for controlling electrical power to the motors.

Figure 2:
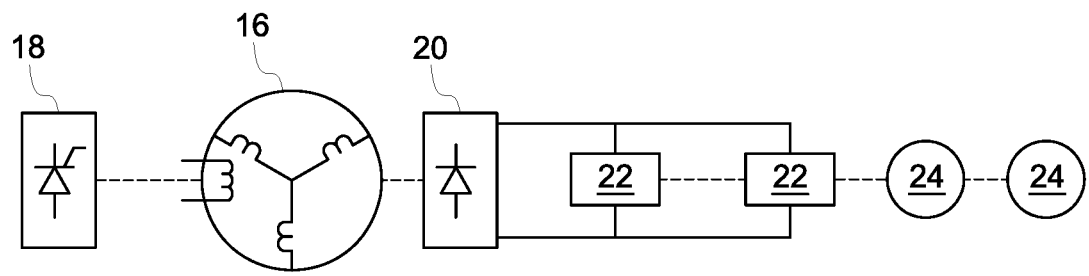
FIG. 2 is a simplified schematic representation of a power circuit for a traction vehicle.

FIG. 2 illustrates a simplified schematic representation of the electrical traction system for the vehicle 10, which includes an alternator 16 driven by an on-board internal combustion engine such as a diesel engine (not shown). Power output of the alternator 16 is regulated in a well known manner by field excitation control indicated by block 18. Electrical power (e.g., AC electric power) from alternator 16 is rectified by one or more rectifiers 20 (e.g., to DC electric power), and an output of the rectifier(s) is coupled to one or more inverters 22 (e.g., by way of a DC bus). Inverters 22 use high power semiconductor switching devices such as IGBTs or GTOs to convert the rectified power to variable frequency, variable amplitude power for application to AC motors 24.

Referring again to FIG. 1, electrical power circuits are at least partially located in an inverter drive assembly compartment or envelope 26. Within envelope 26, the high power semiconductor devices (not shown in FIG. 1) are mounted to air cooled heat sinks. The control electronics for the inverters 22 and field control 18 as well as other electronic components are packaged on circuit boards held in racks in envelope 26. Mounted outside the compartment 26 are one or more blowers (now shown) which provide air cooling for the electrical compartment and the heat sinks.

Figure 3:
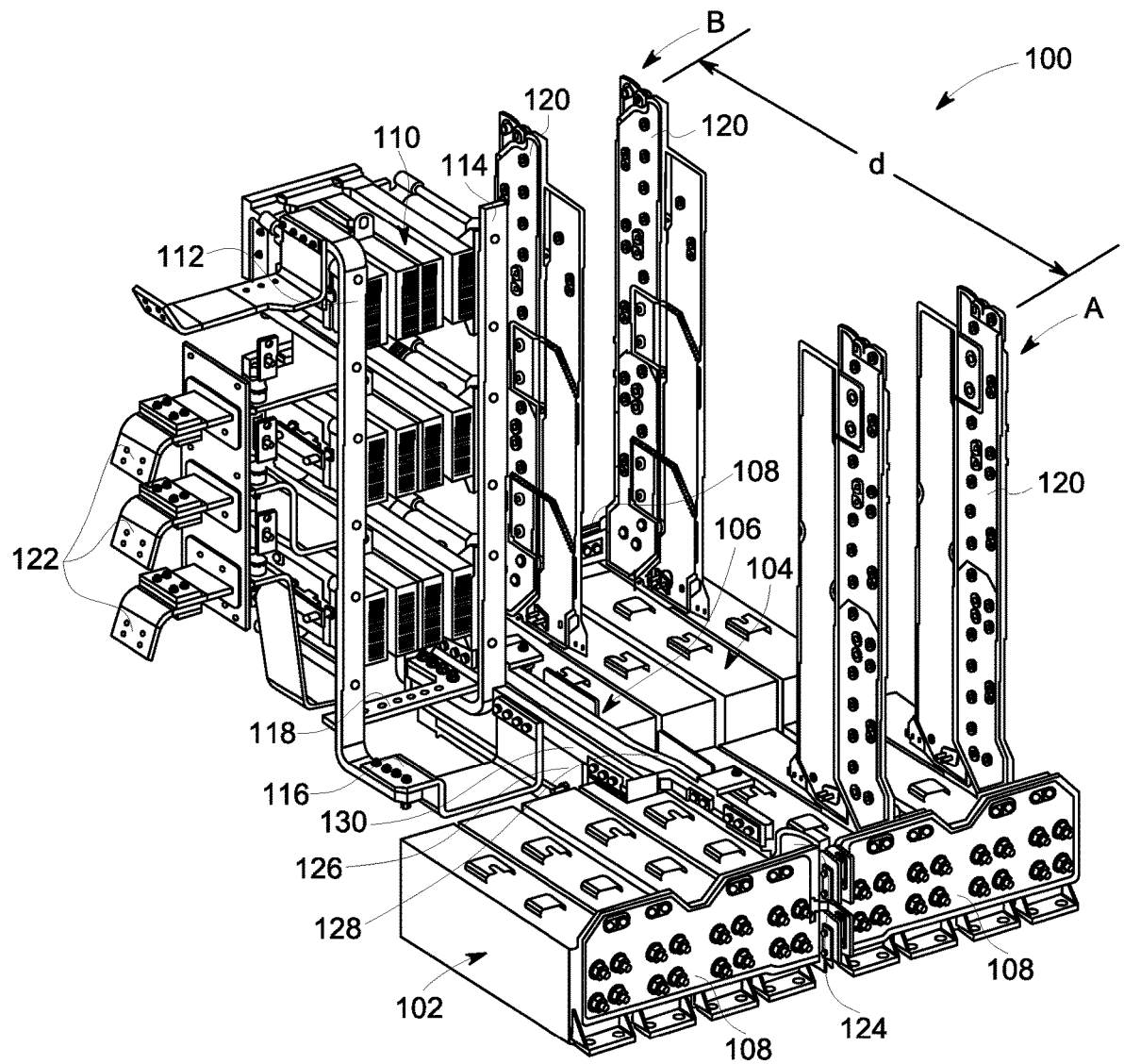
FIG. 3 is a perspective view of an inverter drive assembly for the vehicle of FIG. 1.

FIG. 3 is a perspective view of an inverter drive assembly 100 of the vehicle 10 (e.g., locomotive), which is located in an envelope or compartment 26, according to an embodiment of the invention. As shown therein, the assembly 100 includes a first capacitor bank 102 located on a first side, A, of the vehicle 10, and a second capacitor bank 104 located on a second side, B, of the vehicle 10. In an embodiment, the A side and B side of the vehicle are spaced apart by a distance, d. In an embodiment, the distance, d, may be from three to seven feet (0.9 to 2.2 m), or more specifically, from four to six feet (1.2 to 1.8 m), or more specifically, approximately five feet (1.5 m). Each capacitor in the capacitor banks 102, 104 is mounted and electrically connected to a horizontal bus bar 108. In an embodiment, each horizontal bus bar 108 is mounted to an array of four capacitors. The horizontal bus bars 108 associated with each capacitor bank 102, 104 are, themselves, electrically connected to one another via a crossover bus bar 106. Accordingly, the crossover bus bar 106 serves to connect each of the capacitor banks 102, 104 (and the capacitors thereof) to one another.

With further reference to FIG. 3, the assembly 100 also includes a plurality of rectifiers 110 that are electrically connected to the crossover bus bar 106 via rectifier bus bars 112, 114. As shown, rectifier bus bar extensions 116, 118 may be utilized to connect the crossover bus bar 106 to the distal ends of the rectifier bus bars 116, 118, respectively. A plurality of vertical bus bars 120 may be mounted to the horizontal bus bars 108 associated with each capacitor bank such that the horizontal bus bars 108 connect the vertical bus bars 120 to each capacitor. As illustrated in FIG. 3, in an embodiment, there are four vertical bus bars 120, two such bus bars 120 on the A side of the vehicle, and two such bus bars 120 on the B side of the vehicle. The vertical bus bars 120 are configured to receive a plurality of inverters (not shown in this view) that function to convert direct current to alternating current for supply to the traction motors 24 of the vehicle in the manner described below.

During operation, alternating current is fed to the assembly 100 from an alternator (not shown) via AC bus bars 122. The rectifiers 110 are configured to convert the alternating current to direct current, which is then fed through the rectifier bus bars 112, 114 and rectifier bus bar extensions 116, 118 to the crossover bus bar, which provides an electrical pathway for the current to the horizontal bus bars 108, and ultimately to the capacitor banks 102, 104. The capacitors are configured to supply the direct current to inverter modules (not shown) that are mounted to the vertical bus bars 120, which is then inverted to AC power of controlled frequency and amplitude and supplied to the traction motors of the vehicle 10.

Figure 4:
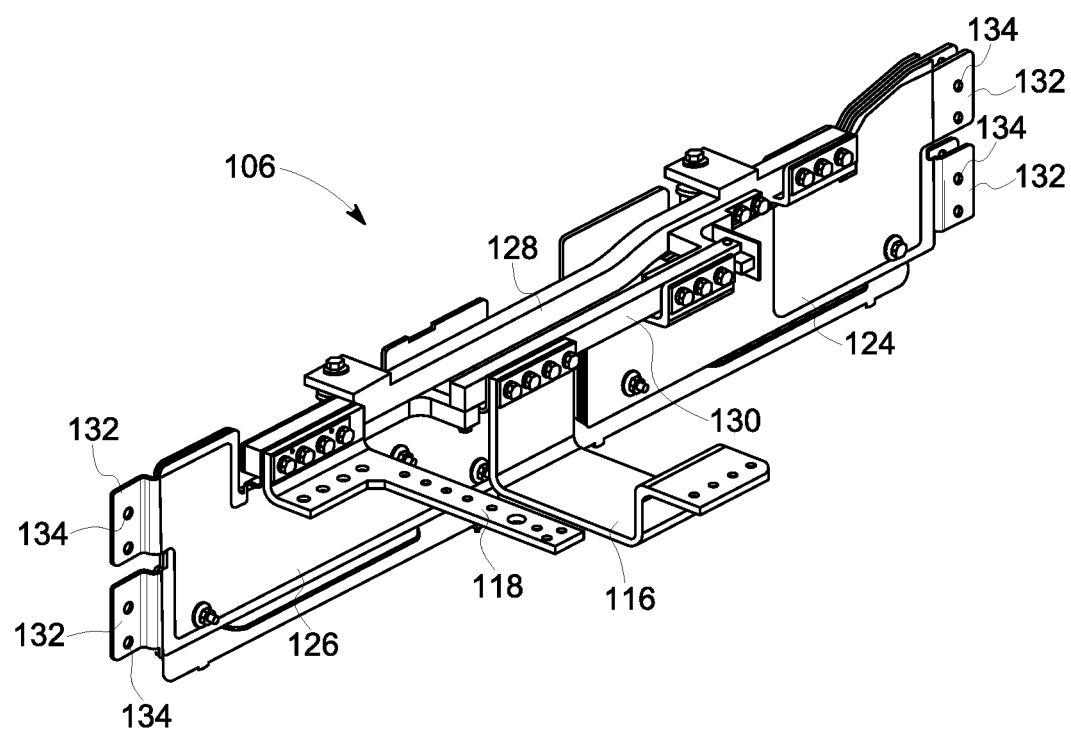
FIG. 4 is an enlarged, perspective view of a crossover bus bar of the inverter drive assembly of FIG. 3.

Turning now to FIG. 4, an enlarged, detail view of the crossover bus bar 106 is illustrated. The crossover bus bar 106 uses a combination of solid bus and laminated bus connections to connect multiple inverters spaced apart by a few feet (approximately 1 meter) on the opposing sides of the vehicle. In particular, as illustrated therein, the crossover bus bar 106 includes a first or A side laminated bus section 124 having a plurality of layers, a second or B side laminated bus section 126 having a plurality of layers, as well as a solid bus connection that includes a positive, solid bus bar 128 interconnecting the first and second bus sections 124, 126 and a negative, solid bus bar 130 interconnecting the first and second bus sections 124, 126. (In the context of two components, positive and negative means the components are configured, in conjunction with a circuit in which the components are to be used, for (i) one component to conduct a positive voltage and the other a ground or negative voltage, or (ii) one component to conduct a negative voltage and the other a ground voltage.) The positive solid bus bar 128 may be connected to respective positive conducting layers of the first and second laminated bus sections 124, 126, and the negative solid bus bar 130 may be connected to respective negative conducting layers of the first and second laminated bus sections 124, 126. For each laminated bus section, the positive conducting layer(s) may be electrically isolated from the negative conducting layer(s). The first and second bus sections 124, 126 are substantially coplanar but are spaced apart such that they do not directly contact one another. In an embodiment, the laminated bus sections 124, 126 may be constructed in a manner generally known in the art. As illustrated, the rectifier bus bar extensions 116, 118 may be connected to the negative and positive bus bars 130, 128 of the crossover bus bar 106 via suitable fasteners. As further shown in FIG. 4, each of the laminated bus sections 124, 126 has a plurality of tabs 132 for interconnecting with the horizontal bus bars 108. For example, vias 134 on each tab 132 are configured as bushings for receiving threaded fasteners, such as cap screws (not shown) for electrically connecting the tabs 132 of the laminated bus sections 124, 126 with corresponding tabs (not shown) on the horizontal bus bars 108 on the A and B side of the vehicle, respectively.

Figure 5:
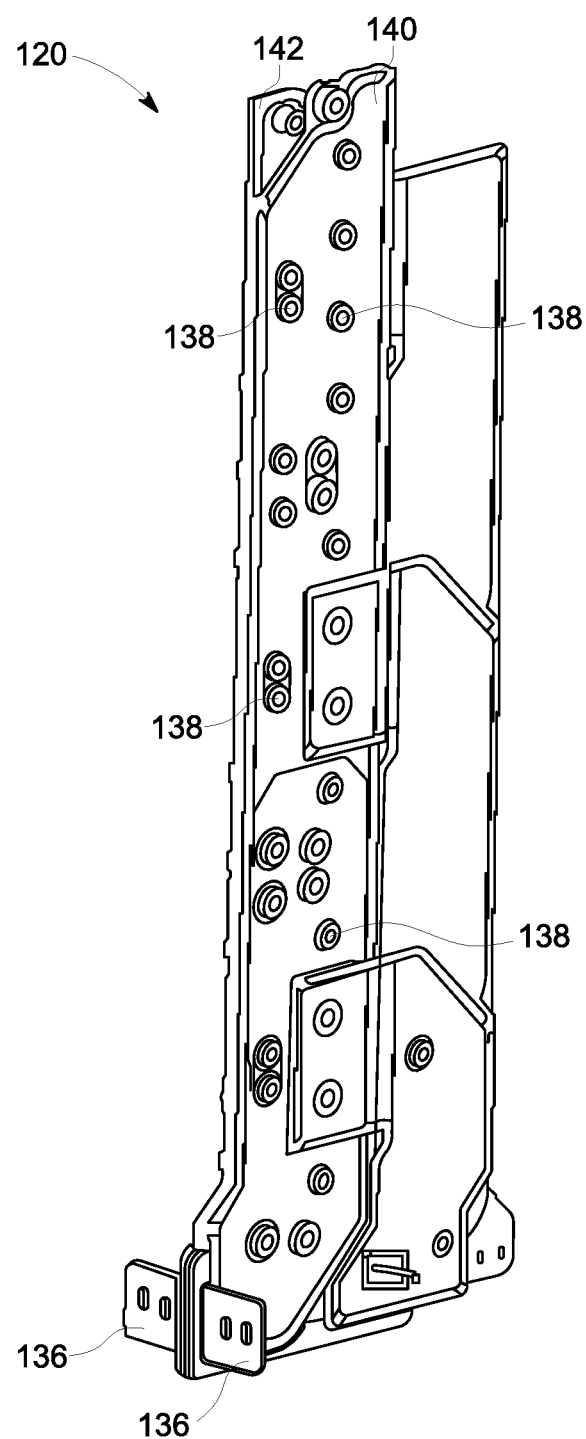
FIG. 5 is an enlarged, perspective view of a vertical bus bar of the inverter drive assembly of FIG. 3.

Turning now to FIG. 5, an enlarged, detail view of a vertical bus bar 120 is illustrated. As shown therein, each vertical bus bar 120 is a laminated bus bar having a plurality of layers, such as layers 140, 142. The vertical bus bars 120 include a pair of tabs 136 a lower end thereof which allow for mounting of the vertical bus bars 120 to the horizontal bus bars 108, as indicated above. In addition, each vertical bus bar 120 includes a plurality of vias 138 by which inverters (not shown) may be mounted. For example, the vias 138 may be configured as bushings for receiving threaded fasteners, such as cap screws (not shown) for electrically connecting terminals of the inverters with the bus bar layers of the bus bar 120.

Figure 6:
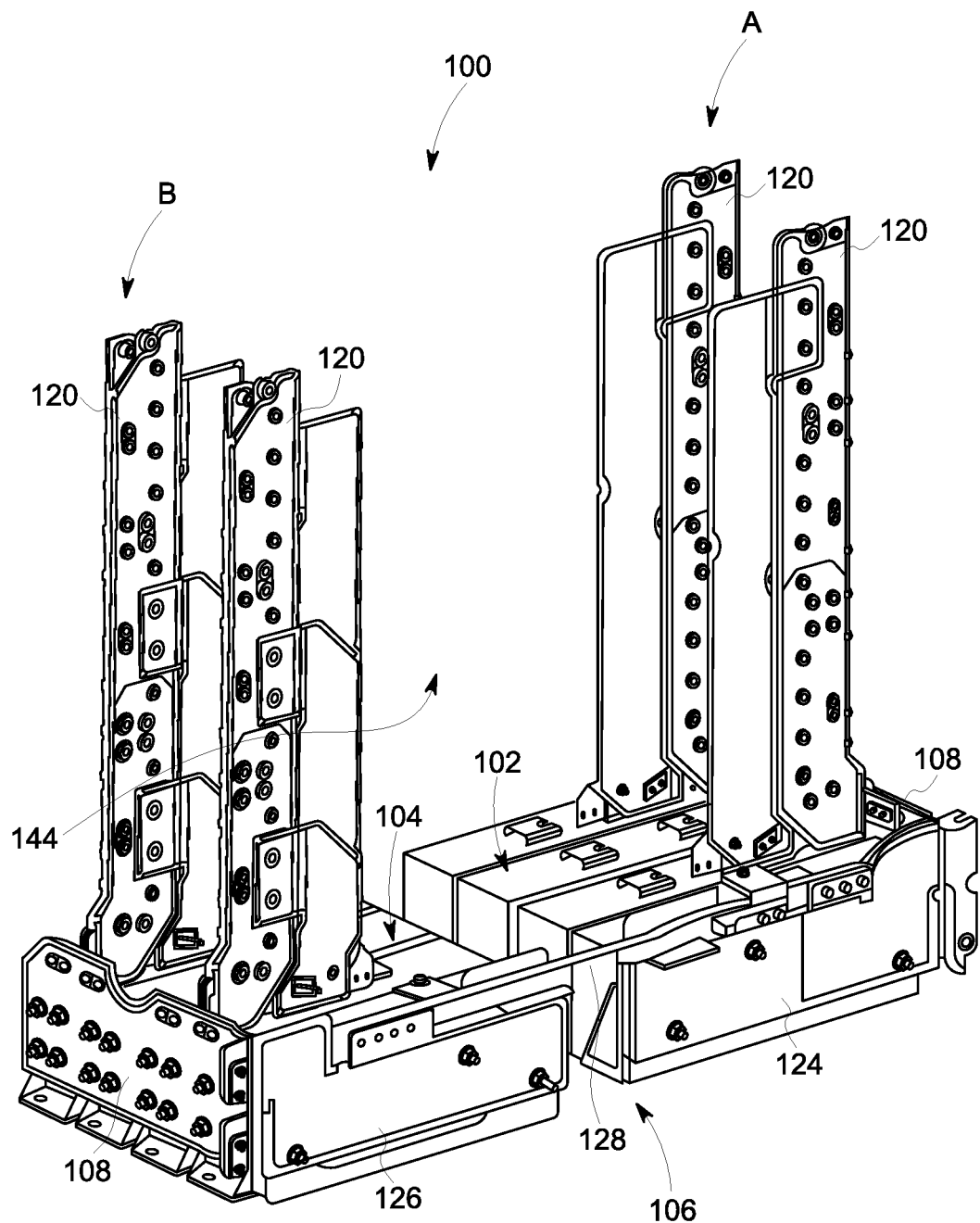
FIG. 6 is a detail, perspective view of a horizontal bus bar to crossover bus bar interface of the inverter drive assembly of FIG. 3.

Referring now to FIG. 6 a partial, cross-sectional view of the assembly 100 is illustrated. As shown, the crossover bus bar 106 is utilized to connect the capacitor banks 102, 104, and thus the inverters (mounted on the vertical bus bars 120, but not illustrated) on the opposed sides of the vehicle. In particular, the crossover bus bar 106 serves as a connection between the inverters mounted on the vertical bus bars 120 on the A side of the vehicle and the inverters mounted on the vertical bus bars 120 on the B side of the vehicle. As best shown therein, the crossover bus bar 106 is located at the very bottom of the assembly (i.e., at the bottom of the envelope or compartment within which the assembly 100 is housed). Moreover, as shown in FIG. 6, the first laminated bus section 124 of the crossover bus bar 106 provides a laminated bus connection between the horizontal bus bar 108 of the first capacitor bank 102, while the second laminated bus section 126 of the crossover bus bar 106 provides a laminated bus connection between the horizontal bus bar 108 of the second capacitor bank 104. As indicated above, the solid bus bars 128, 130 of the crossover bus bar 106 (positive, solid bus bar 128 being shown in FIG. 6) serve to bridge the gap between the laminated bus sections 124, 126 and connect the laminated bus sections 124, 126 to one another. As also shown in FIG. 6, the opposed vertical bus bars 120 define a plenum 144 therebetween through which ventilation air is circulated to cool the components of the assembly 100.

Figure 7:
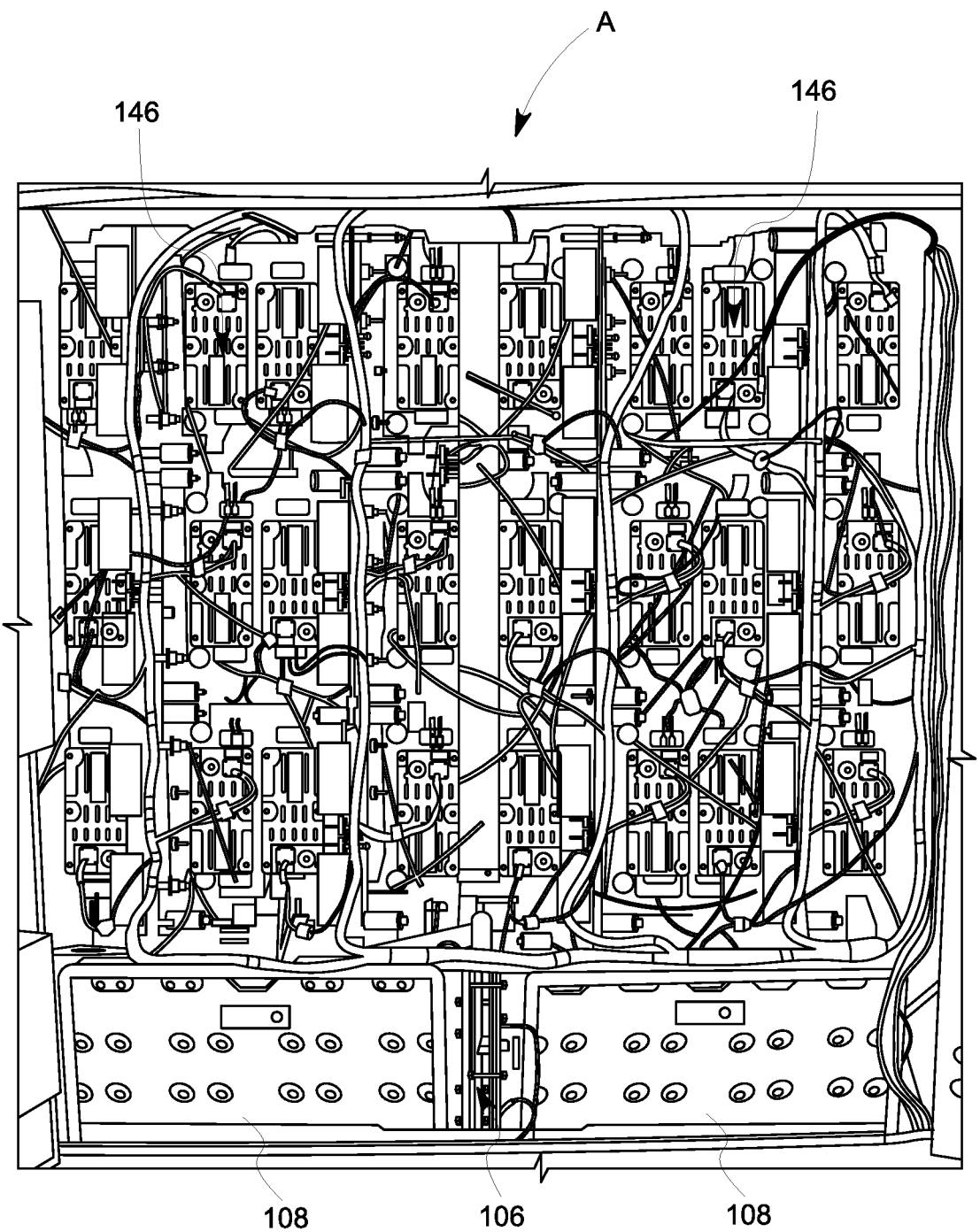
FIG. 7 is a side, elevational view of the inverter drive assembly of FIG. 3 as viewed from an A side (i.e., first side) of the vehicle.
Figure 8:
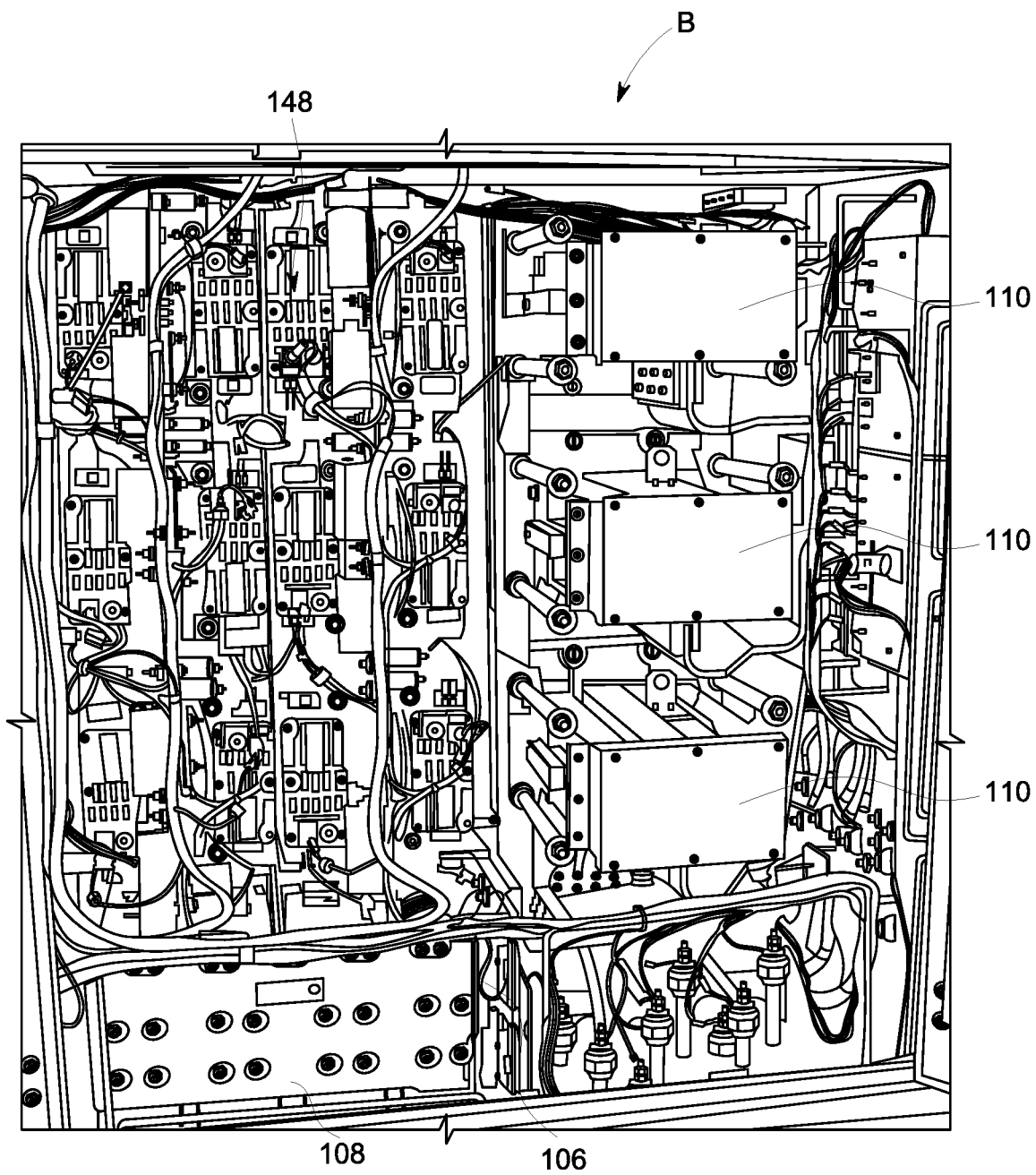
FIG. 8 is a side, elevational view of the inverter drive assembly of FIG. 3 as viewed from a B side (i.e., second side) of the vehicle.

With reference to FIGS. 7 and 8, the inverter drive assembly of the present invention, as viewed from the A and B sides, respectively, of a six-axle vehicle is illustrated. As shown in FIG. 7, the A side of the vehicle provides access to a first array of inverters 146, including inverters three through six, for powering traction motors three through six of the vehicle, as well as to the horizontal bus bars 108 to which the first capacitor bank 102 is mounted. As shown in FIG. 8, the B side of the vehicle provides access to a second array of inverters 148, including inverters one and two, for powering traction motors one and two of the vehicle, as well as to the horizontal bus bar 108 to which the second capacitor bank 104 is mounted and to rectifiers 110. As indicated above, the inverters 146 on the A side of the vehicle and the inverters 148 on the B side of the vehicle may be spaced apart by a distance, d, as shown in FIG. 3, where d may be approximately five feet (1.5 m). As discussed in detail above, the inverters 146 on the A side of the vehicle and the inverters 148 on the B side of the vehicle are electrically connected to one another through crossover bus bar 106.

While FIGS. 7 and 8 show the arrangement of a six inverter system, the present invention is not so limited in this regard. In particular, embodiments of the invention are applicable to any inverter configuration and quantity, such as an eight inverter system with, for example, five inverters arranged on the A side of the vehicle and three on the B side, and a four inverter system with, for example, three inverters on the A side and one on the B side.

As will be readily appreciated, the use of the laminated bus sections 124, 126 in the crossover bus bar 106 serves to reduce the induction, and thus circulating currents, between the capacitor banks 102, 104 and the inverters 146, 148 on the opposing sides of the vehicle, which is particularly desirable for lower voltage offshoots during IGBT switching. In particular, the crossover bus bar 106, and the separate laminated bus sections thereof 124, 126 that are themselves connected by solid bus sections 128, 130, allow for a reduction in circulating currents even when inverters are placed far apart (e.g., approximately five feet or 1.5 m apart on opposing sides of the vehicle). Indeed, the lower inductance between inverters that results from the use of the crossover bus bar 106 with laminated bus sections 124, 126 leads to more even current distribution between capacitors and lower DC link ripple when multiple inverters switch on the same link. As will be readily appreciated, this allows the rating of power components to be reduced vis-à-vis existing inverter drive assembly arrangements utilizing a purely solid bus connection between inverters.

Moreover, during axle cut-out, there is a potential difference between loaded inverters and a cut-out inverter. A higher inductance path will lead to a greater voltage difference and thus greater circulating current. During axle cut-out, therefore, the circulating current should be within a reasonable range. In addition, there may be a phase difference between various inverters. The assembly arrangement of embodiments of the invention, however, minimizes the current imbalance due to a phase difference between multiple inverters, yielding better electrical performance than existing sold bus bar interconnection arrangements.

In addition, the particular arrangement and configuration of embodiments of the assembly 100 allows for a reduction in height of the assembly by approximately three inches (7 to 8 cm) vis-à-vis known inverter drive assemblies for substantially similar applications, which helps increase the ground clearance of the vehicle. This height reduction may be realized by the utilization of the crossover bus bar 106, and the ability to locate the crossover bus bar 106 at the bottom of the envelop, rather than at the top. Moreover, the assembly may utilize fewer components, as a whole, which leads to a faster and more streamlined assembly process, as well as to a reduction in weight and cost. In addition, the assembly may be easier to service than existing inverter drive arrangements.

In connection with the above, embodiments provide for a compact and flexible inverter arrangement that meets existing packaging and ventilation constraints for vehicles. In particular, the crossover bus bar 106 provides a low inductance path to connect multiple inverters while simultaneously addressing mechanical packaging, assembly, and manufacturing constraints. This low inductance connection between inverters may ensure good electrical performance in terms of DC ripple and capacitor current distribution. This, in turn, may help to improve inverter drive assembly reliability.

Through testing, it has been demonstrated that embodiments of the inverter drive assembly, which include the hybrid crossover bus bar 106 (with both laminated and solid bus bar sections), have better electrical performance characteristics than a purely solid bus connection, a purely laminated bus connection, or a cable connection. In particular, embodiments of the crossover bus bar have been demonstrated to provide acceptably high resonance frequency between inverters while meeting assembly and package requirements. In addition, it has been demonstrated that embodiments of the crossover bus bar with both laminated and solid bus sections yields a current reduction during axle cut-out as compared to existing solid bus designs. Moreover, it has been demonstrated that there is a wider variation in capacitor RMS current due to phase lag with existing solid bus arrangements as compared to embodiments of the hybrid crossover bus bar of the present invention.

In embodiments, individual power capacities of one or more of the bus bars described herein are from 10 kW to 3000 kW, reflecting that the bus bars may be configured to handle the relatively high current and/or voltage levels of electric power for traction motors of a vehicle.

According to various aspects, a laminated bus bar is one that includes at least two flat conductors at least portions of which are separated from one another by an insulation layer and packaged all together as an adhered, integrated unit. The flat conductors may be relatively thin, e.g., length and width both greater than thickness. For example, the flat conductors may be copper sheets, or sheets of another metal or metal alloy. The insulation layer may be a relatively high dielectric insulation layer, meaning providing a sufficient voltage isolation between the flat conductors for the electrical power application in which the bus bar is used. The two conductors may be disposed parallel to one another such that they sandwich the dielectric insulation layer. A solid bus bar may have one or more of the following characteristics: monolithic bar of metal; a single piece of metal, possibly with an outer insulator coat or jacket, but not integrally adhered with another conductor separated from the piece of metal by an insulation layer; not flat or planar; relatively thick, e.g., length may be greater than width and thickness, but thickness and width are at or within 3× of one another (for example); rigid/inflexible; and/or thickness (smallest dimension) of at least 1 cm. As noted herein, a bus bar assembly may include a laminated bus bar connected to a solid bus bar.

In an embodiment, a bus bar includes a first laminated bus section and a second laminated bus section. The first laminated bus section has one or more first positive conducting layers and one or more first negative conducting layers. The one or more first positive conducting layers may be parallel to and electrically insulated from the one or more first negative conducting layers. The second laminated bus section has one or more second positive conducting layers and one or more second negative conducting layers. The one or more second positive conducting layers may be parallel to and electrically insulated from the one or more second negative conducting layers. The bus bar also includes a solid bus connection that comprises a positive solid bus bar and a negative solid bus bar, which are electrically insulated from one another. The positive solid bus bar electrically interconnects at least one of the one or more first positive conducting layers of the first laminated bus section with at least one of the one or more second positive conducting layers of the second laminated bus section. The negative solid bus bar electrically interconnects at least one of the one or more first negative conducting layers of the first laminated bus section with at least one of the one or more second negative conducting layers of the second laminated bus section. The positive and negative solid bus bars are elongate, with the first laminated bus section attached to first ends of the positive and negative solid bus bars and the second laminated bus section attached to second, distal ends of the positive and negative solid bus bars, such that the first laminated bus section is spaced apart from the second laminated bus section by a distance at least partially defined by lengths of the solid bus bars. The first and second laminated bus sections may be co-planar. The positive and negative solid bus bars are configured for respective electromechanical attachment to positive and negative buses of a rectifier system output (e.g., positive and negative DC output of a rectifier). The first and second laminated bus sections are configured for additional, direct or indirect electrical attachment to one or more of plural capacitor banks, additional laminated bus bars, and inverters. In operation, the positive and negative solid bus bars are used to route positive and negative electrical power from the rectifier system bus to the laminated bus sections (e.g., spaced apart from one another on opposite sides of a vehicle), which distribute it to plural inverters (e.g., for converting DC power to AC power) either directly or by way of capacitor banks and/or additional laminated bus bars.

In an embodiment, an inverter drive assembly is provided. The inverter drive assembly includes a first array of inverters, a second array of inverters spaced from the first array of inverters and defining a plenum therebetween, and a crossover bus bar spanning the plenum and electrically connecting the first array of inverters to the second array of inverters. The crossover bus bar includes a first laminated bus section electrically connected to the first array of inverters, a second laminated bus section electrically connected to the second array of inverters, and a solid bus connection interconnecting the first laminated bus section with the second laminated bus section. In an embodiment, the solid bus connection includes a positive interconnecting bus bar and a negative interconnecting bus bar extending between the first laminated bus section and the second laminated bus section. In an embodiment, the inverter drive assembly includes a first horizontal bus bar coupled to a distal end of the first laminated bus section and a second horizontal bus bar coupled to a distal end of the second laminated bus section. In an embodiment, the inverter drive assembly includes a first capacitor bank electrically connected to the first horizontal bus bar and a second capacitor bank electrically connected to the second horizontal bus bar. In certain embodiments, the inverter drive assembly includes at least one first vertical bus bar coupled to the first horizontal bus bar and extending substantially vertically therefrom and at least one second vertical bus bar coupled to the second horizontal bus bar and extending substantially vertically therefrom. In an embodiment, the at least one first vertical bus bar and the at least one second vertical bus bar are laminated bus bars. In an embodiment, the first array of inverters are electrically coupled to the at least one first vertical bus bar and the second array of inverters are electrically coupled to the at least one second vertical bus bar. In an embodiment, the inverter drive assembly includes a plurality of rectifiers electrically connected to the crossover bus bar via at least one rectifier bus bar. In an embodiment, the crossover bus bar is configured to pass DC current received from the plurality of rectifiers to the first array of inverters and the second array of inverters for conversion into the AC power. In an embodiment, the inverter drive assembly defines an envelope and the crossover bus bar is positioned adjacent to a bottom of the envelope.

In an embodiment, a bus bar is provided. The bus bar includes a first laminated bus section, a second laminated bus section, and a solid bus connection interconnecting the first laminated bus section with the second laminated bus section. In an embodiment, the solid bus connection includes a positive, solid bus bar and a negative, solid bus bar extending between the first laminated bus section and the second laminated bus section. In an embodiment, the first laminated bus section and the second laminated bus section are generally coplanar and are spaced apart from one another. In an embodiment, the bus bar is configured to pass DC current received from a plurality of rectifiers to an array of inverters oriented on opposing sides of a vehicle and spaced apart by an air plenum for conversion into AC power.

In an embodiment, a vehicle is provided. The vehicle includes a plurality of AC electric motors each coupled in driving relationship to a respective pair of a plurality of pairs of wheels on the vehicle, a plurality of inverters mounted in the vehicle including at least a first inverter mounted adjacent to a first side of the vehicle and a second inverter mounted adjacent to a second, opposing side of the vehicle, the inverters being configured to receive DC electric power and to invert the DC electric power to AC electric power for application to the AC electric motors, and a crossover bus bar electrically connecting the first inverter to the second inverter. The crossover bus bar includes a first laminated bus section electrically connected to the first inverter and a second laminated bus section electrically connected to the second inverter. The first laminated bus section and the second laminated bus section are generally coplanar and are spaced apart from one another. In an embodiment, the crossover bus bar includes a solid bus bar electrically connecting the first laminated bus section to the second laminated bus section. In an embodiment, the solid bus bar includes a positive interconnecting bus bar extending from the first laminated bus section to the second laminated bus section and a negative interconnecting bus bar extending from the first laminated bus section to the second laminated bus section. In an embodiment, the crossover bus bar is electrically connected to a plurality of rectifiers via at least one rectifier bus bar. In an embodiment, the crossover bus bar is electrically connected to the at least one rectifier bus bar via a rectifier bus bar extension extending from at least one of the positive and negative interconnecting bus bars of the crossover bus bar to the at least one rectifier bus bar. In an embodiment, the first laminated bus section is electrically connected to a first horizontal bus bar mounted to a first capacitor bank located adjacent to the first side of the vehicle and the second laminated bus section is electrically connected to a second horizontal bus bar mounted to a second capacitor bank located adjacent to the second side of the vehicle. In an embodiment, the first inverter is mounted to a first vertical bus bar extending substantially vertically from the first horizontal bus bar and the second inverter is mounted to a second vertical bus bar extending substantially vertically from the second horizontal bus bar. In certain embodiments, the first and second vertical bus bars are laminated bus bars. In an embodiment, the crossover bus bar is configured to pass DC current received from the plurality of rectifiers to the at least one first inverter and the at least one second inverter for conversion into the AC power.

According to an aspect, first and second (e.g., A and B) sides of vehicle are defined based on a longitudinal (long) axis of the vehicle, wherein the first side is on one side of the longitudinal axis and the second side is on the other side of the longitudinal axis. Generally, a given part/device is located adjacent to a given side when the part/device is positioned on the same side of the longitudinal axis as the given side, and in a more specific example, when the given part/device is positioned on that same side and closer to the side edge of the vehicle than the longitudinal axis.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The terms "including" and "in which" are used as the plain-English equivalents of the respective terms "comprising" and "wherein." Moreover, the terms "first," "second," "third," "upper," "lower," "bottom," "top," etc. are used merely as labels, and are not intended to impose numerical or positional requirements on their objects.

This written description uses examples to disclose several embodiments of the invention, including the best mode, and also to enable one of ordinary skill in the art to practice the embodiments of invention, including making and using any devices or systems and performing any incorporated methods.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the embodiments described herein, it is intended that all of the subject matter of the above description or shown in the accompanying drawings shall be interpreted merely as examples illustrating the inventive concept herein and shall not be construed as limiting the invention.

What is claimed is:

1. An inverter drive assembly, comprising:
   at least one first inverter;
   at least one second inverter spaced from the at least one first inverter and defining a plenum therebetween; and
   a crossover bus bar spanning the plenum and electrically connecting the at least one first inverter to the at least one second inverter, the crossover bus bar including a first laminated bus section electrically connected to the at least one first inverter, a second laminated bus section electrically connected to the at least one second inverter, and a solid bus connection interconnecting the first laminated bus section with the second laminated bus section,
   wherein the at least one first inverter and the at least one second inverter are configured to drive one or more electrical loads.

2. The inverter drive assembly of claim 1, wherein:
   the solid bus connection includes a positive interconnecting bus bar and a negative interconnecting bus bar both extending between the first laminated bus section and the second laminated bus section.

3. The inverter drive assembly of claim 2, further comprising:
   a first bus bar coupled to a distal end of the first laminated bus section and a second bus bar coupled to a distal end of the second laminated bus section.

4. The inverter drive assembly of claim 3, further comprising:
   a first capacitor bank electrically connected to the first bus bar; and
   a second capacitor bank electrically connected to the second bus bar.

5. The inverter drive assembly of claim 4, further comprising:
   at least one third bus bar coupled to the first bus bar and extending therefrom; and
   at least one fourth bus bar coupled to the second bus bar and extending vertically therefrom.

6. The inverter drive assembly of claim 5, wherein:
   the at least one third bus bar and the at least one fourth bus bar are laminated bus bars.

7. The inverter drive assembly of claim 6, wherein:
   the at least one first inverter is electrically coupled to the at least one third bus bar; and
   the at least one second inverter is electrically coupled to the at least one fourth bus bar.

8. The inverter drive assembly of claim 7, further comprising:
   a plurality of rectifiers electrically connected to the crossover bus bar via at least one rectifier bus bar.

9. The inverter drive assembly of claim 8, wherein:
   the crossover bus bar is configured to pass DC current received from the plurality of rectifiers to the at least one first inverter and the at least one second inverter for conversion into AC power.

10. The inverter drive assembly of claim 9, wherein:
    the inverter drive assembly defines an envelope; and
    the crossover bus bar is positioned adjacent to a bottom of the envelope.

11. A vehicle comprising:
    the inverter drive assembly of claim 1; and
    the one or more electrical loads, the one or more electrical loads comprising at least one motor.

12. The vehicle of claim 11, wherein the vehicle is a rail vehicle.

13. The inverter drive assembly of claim 1 wherein the solid bus connection is configured to electrically interconnect a first laminated bus section and a second laminated bus section each having at least one respective inverter coupled thereto,
    wherein the solid bus connection comprises at least one monolithic bar of metal having a thickness, which is a smallest dimension of the monolithic bar of metal, of at least 1 cm, and wherein along at least a portion of a length of the monolithic bar of metal the monolithic bar of metal is not integrally adhered with another conductor separated from the monolithic bar of metal by an insulation layer.

14. The inverter drive assembly of claim 13, wherein the length of the monolithic bar of metal is greater than the thickness and greater than a width of the monolithic bar of metal.

15. A vehicle comprising:
    one or more electrical loads; and
    the inverter drive assembly of claim 14, wherein the solid bus connection electrically interconnects the first laminated bus section and the second laminated bus section, and wherein each of the at least one respective inverter coupled to the first laminated bus section and to the second laminated bus section is configured to drive one or more of the one or more electrical loads.

16. The vehicle of claim 15, wherein the vehicle is a rail vehicle.

17. The vehicle of claim 15, wherein:
    the first laminated bus section and the second laminated bus section are coplanar and are spaced from one another.

18. The vehicle of claim 15, wherein the crossover bus bar comprises a respective, single, elongate piece of metal that, along at least a portion of a length thereof, is not integrally adhered with another conductor separated from the single, elongate piece of metal by an insulation layer.

* * * * *